(12) United States Patent
Kobayashi

(10) Patent No.: US 7,622,351 B2
(45) Date of Patent: Nov. 24, 2009

(54) METHOD OF MANUFACTURING SEMICONDUCTOR DEVICE AND SEMICONDUCTOR DEVICE

(75) Inventor: Kenya Kobayashi, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 12/348,467

(22) Filed: Jan. 5, 2009

(65) Prior Publication Data

US 2009/0179260 A1 Jul. 16, 2009

(30) Foreign Application Priority Data

Jan. 16, 2008 (JP) .............................. 2008-006563

(51) Int. Cl.
*H01L 21/336* (2006.01)
(52) U.S. Cl. ...................... 438/259; 438/243; 438/246; 438/270; 438/289; 438/700; 257/330; 257/331; 257/334; 257/341; 257/342; 257/E21.04; 257/E21.41
(58) Field of Classification Search ................. 438/246, 438/561; 257/263, 264
See application file for complete search history.

(56) References Cited

U.S. PATENT DOCUMENTS 6,204,533 B1 3/2001 Williams et al.
6,534,367 B2 * 3/2003 Peake et al. ................. 438/270

FOREIGN PATENT DOCUMENTS

JP 2000-031484 1/2000

* cited by examiner

*Primary Examiner*—Fernando L Toledo
*Assistant Examiner*—Kyoung Lee
(74) *Attorney, Agent, or Firm*—Young & Thompson

(57) ABSTRACT

A method of manufacturing a semiconductor device, includes: forming a first and a second trench regions adjacent from each other in a first conductivity type semiconductor base; forming a second conductivity type semiconductor region in the semiconductor base between the first and second trench regions; forming a mask on the second conductivity type semiconductor region, the mask covering a central portion between the first and second trench regions; performing ion implantation of a first conductivity type impurity in the second conductivity type semiconductor region with the mask to form a first conductivity type first region and a first conductivity type second region separated from the first conductivity type first region; and performing heat treatment to diffuse the impurity in the first and second regions and to form a connection region between the first and second regions, connection region being shallower than the first and second regions after the heat treatment.

11 Claims, 15 Drawing Sheets

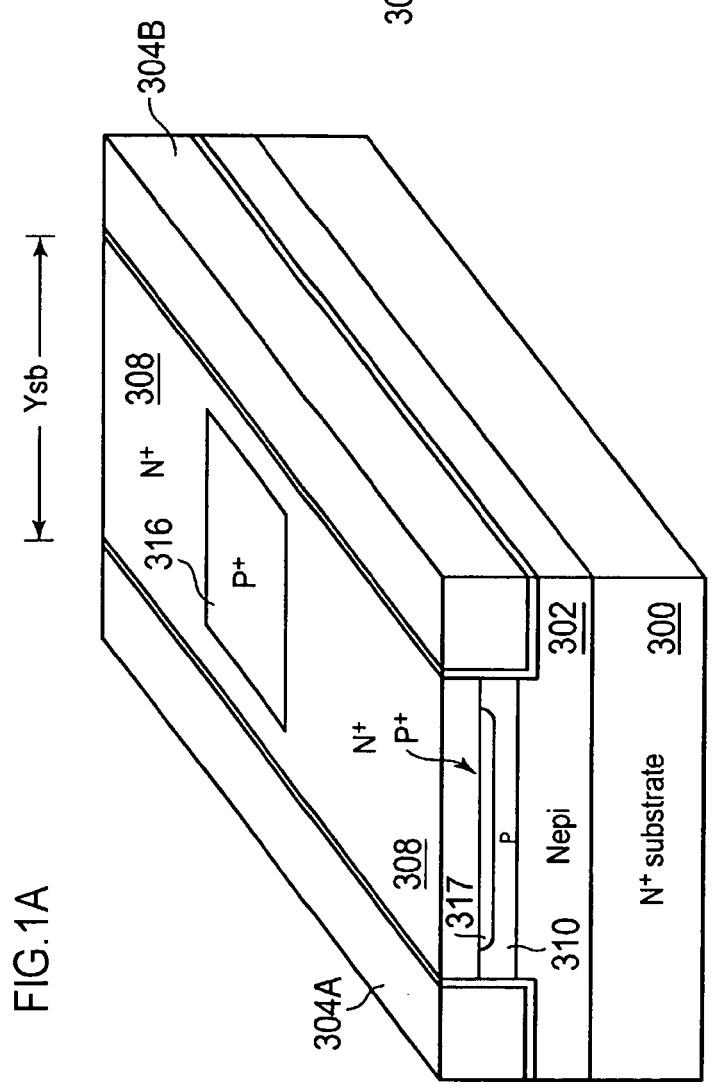
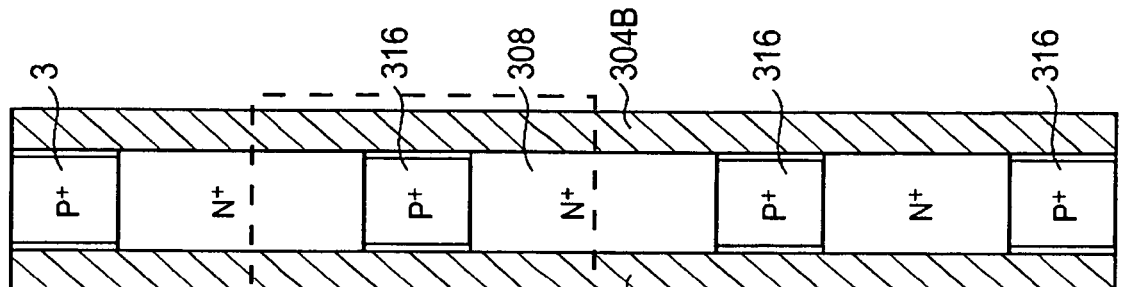
FIG.1A
FIG.1B

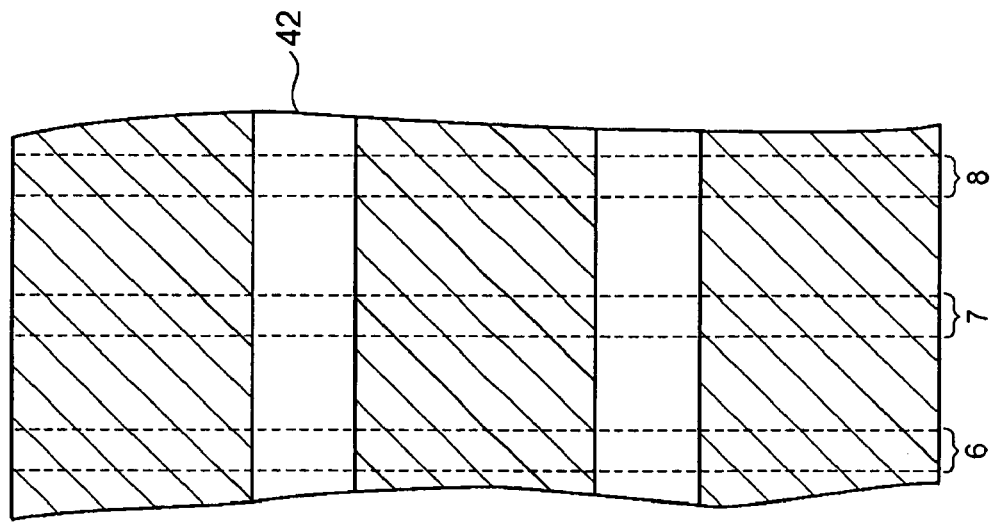
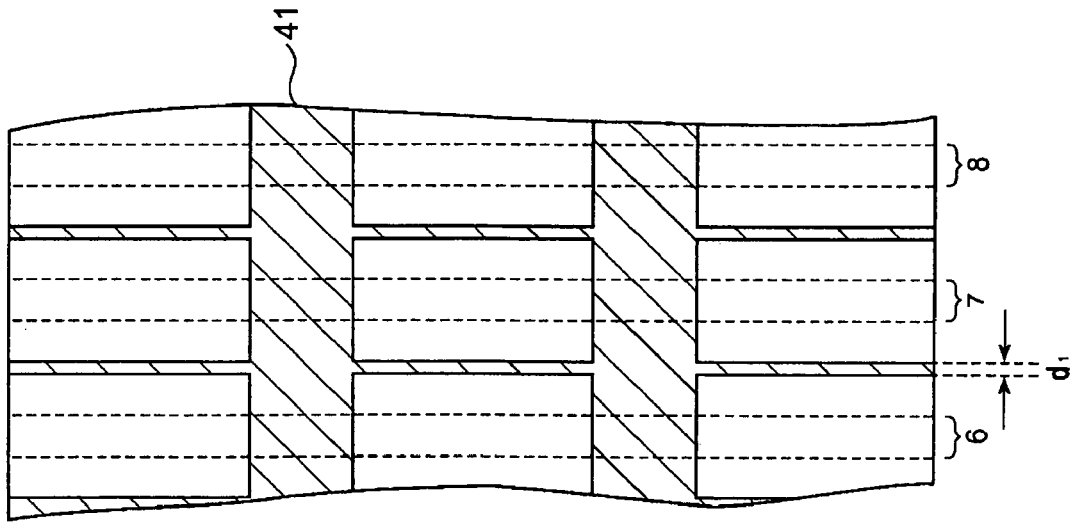

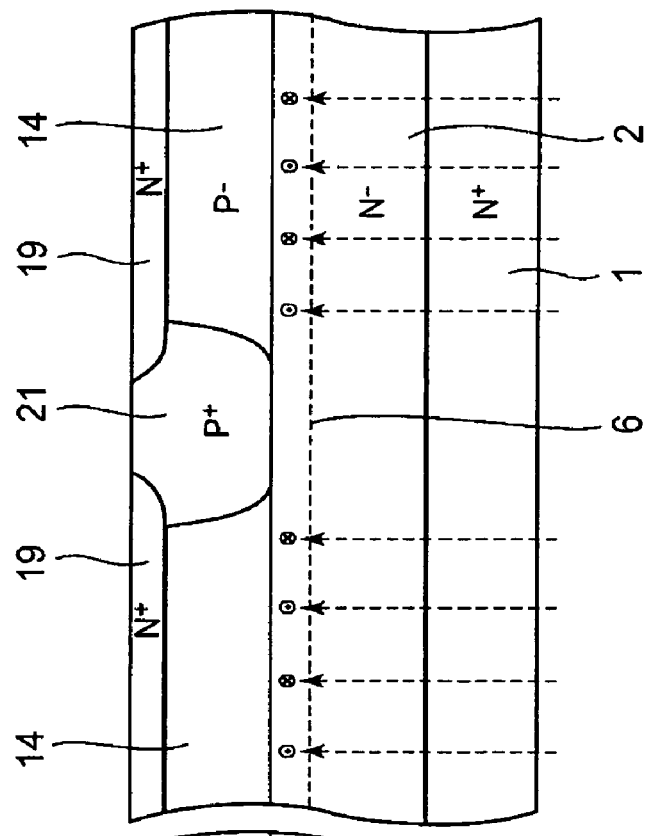
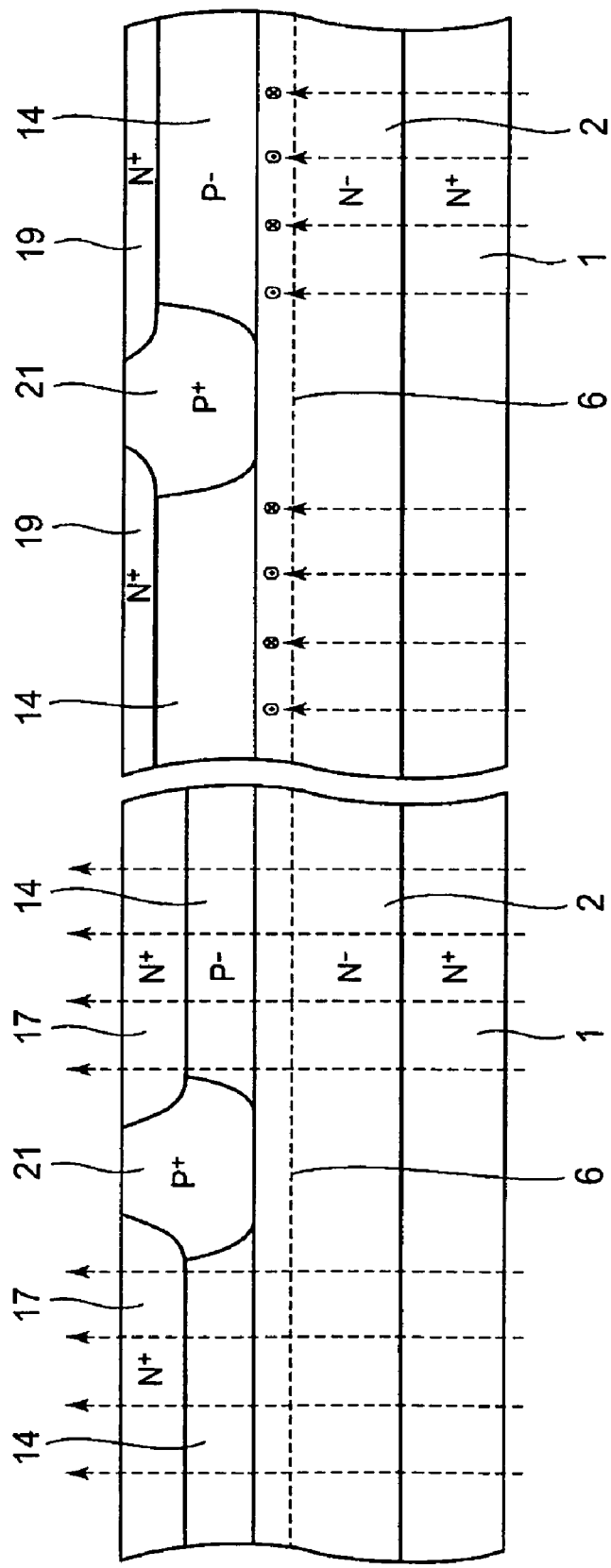

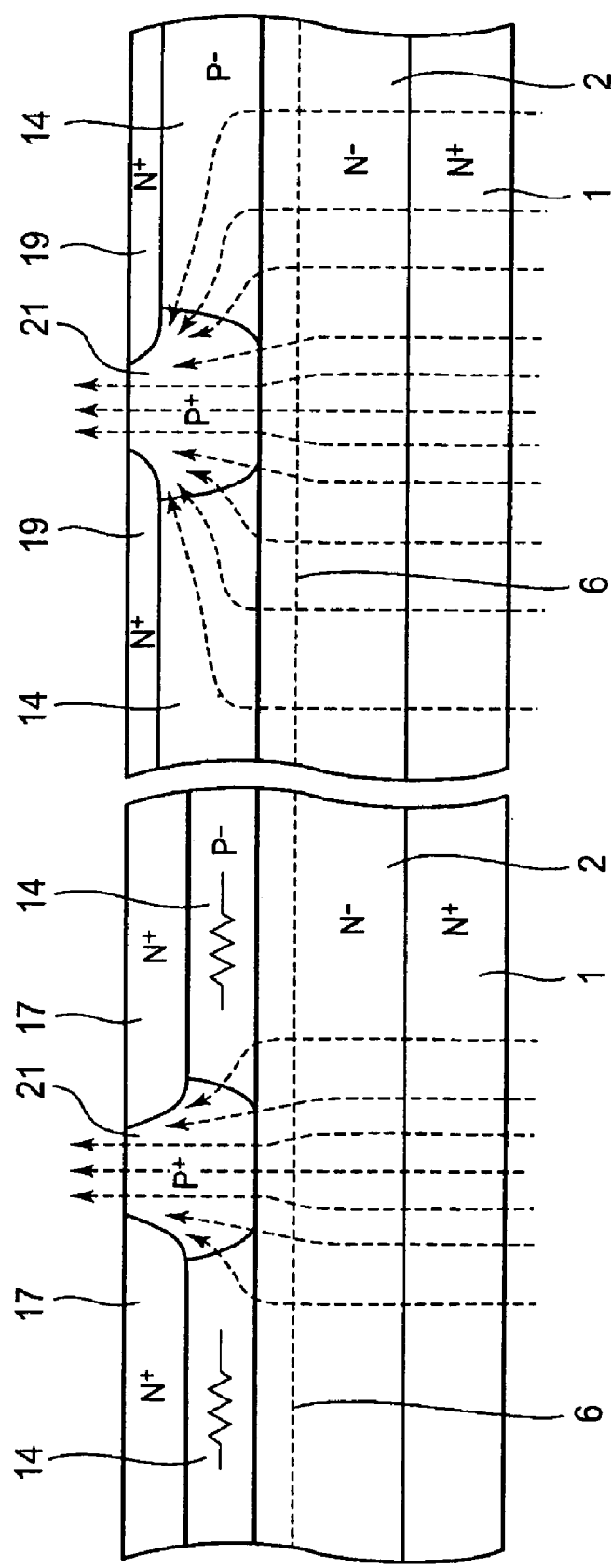

METHOD OF MANUFACTURING SEMICONDUCTOR DEVICE AND SEMICONDUCTOR DEVICE

This application is based on Japanese patent application No. 2008-006563, the content of which is incorporated hereinto by reference.

BACKGROUND

1. Technical Field

The present invention relates to a method of manufacturing a semiconductor device and a semiconductor device having a trench gate electrode.

2. Related Art

A power metal oxide semiconductor field effect transistor (MOSFET) of a trench gate type has the advantage of miniaturization of a transistor cell. Japanese Unexamined patent publication No. 2000-31484, and its patent family U.S. Pat. No. 6,204,533 B1 disclose a vertical type power MOSFET having a plurality of gate portions 304A and 304B which are parallel and elongated stripe shapes as shown in FIGS. 1A and 1B.

As shown in FIG. 1A, a known vertical type power MOSFET includes an $N^+$ substrate 300, an N type epitaxial layer 302 formed on the $N^+$ substrate 300 and a $P^-$ body region 310, an $N^+$ source region 308, and a $P^+$ body contact region 316 formed between the gate portions 304A and 304B. With this structure, stripe shaped cells are formed.

As shown in FIG. 1B, a plurality of the $P^+$ body contact regions 316 are formed at intervals along the stripe shaped cells in order to suppress resistant loss of the $P^-$ body region 310 and voltage drop associated therewith. The portion surrounded by the dotted line in FIG. 1B corresponds to the portion shown in FIG. 1A.

Further, the known semiconductor device has a $P^+$ region 317 just beneath the $N^+$ source region 308 in order to further reduce the voltage drop of the $P^-$ body region 310. The $P^+$ region 317 is formed so as not to reach the N type epitaxial layer 302. The $P^+$ region 317 is formed by ion implantation of impurities with high energy at just beneath the $N^+$ source region 308 after forming the $N^+$ source region 308; or, the $P^+$ region 317 is formed by ion implantation of impurities with low energy in the $P^-$ body region 310 before forming the $N^+$ source region 308.

SUMMARY

However, additional steps of forming the $P^+$ region 317 including formation of a photo mask and ion implantation of impurities are required.

According to the present invention, there is provided a method of manufacturing a semiconductor device, including: forming a first trench region and a second trench region adjacent from each other in a first conductivity type semiconductor base; forming a second conductivity type semiconductor region in the semiconductor base between the first trench region and the second trench region; forming a mask on the second conductivity type semiconductor region, the mask covering a central portion between the first trench region and the second trench region; performing ion implantation of a first conductivity type impurity in the second conductivity type semiconductor region with the mask to form a first conductivity type first region and a first conductivity type second region separated from the first conductivity type first region; and performing heat treatment to diffuse the impurity in the first conductivity type first region and the first conductivity type second region and to form a connection region between the first conductivity type first region and the first conductivity type second region, connection region being shallower than the first conductivity type first region and the first conductivity type second region after the heat treatment.

According to the present invention, there is provided a semiconductor device, including:

a semiconductor body of a first conductivity type;

a base region of a second conductivity type formed in an upper portion of the semiconductor body;

first and second source regions of the first conductivity type formed in an upper portion of the base region, the first and second source regions being separated from each other;

a high concentration base region of the second conductivity type formed in an upper portion of the base region, the high concentration base region being sandwiched by the first and second source regions in a plan view; and a first trench region and a second trench region adjacent from each other in a semiconductor region, the first and second trench regions sandwiching the base region, the first source region, the high concentration base region, and the second source region therebetween in a plan view, each of the first and second trench regions including a trench gate electrode therein, wherein each of the first and second source regions includes:

a first region having a first depth and contacting with the first trench region;

a second region having the first depth and contacting with the second trench region; and a connecting region formed between the first region and the second region and having a second depth shallower than the first depth.

According to this structure, the connection region shallower than the first and second regions is formed by forming the mask covering a central portion between the first and second trench regions performing ion implantation, and performing heat treatment. These steps are same as forming the $N^+$ source region 308 of the related art as shown in FIGS. 1A and 1B. The first and second regions and the connection region of the semiconductor device according to the present invention can be formed only by changing patterns of the mask for forming the $N^-$ source region without additional steps. With this structure, the second conductivity type semiconductor region can be widened and the resistance can be reduced.

The first conductivity type semiconductor base may typically be an $N^-$ drift region that functions as a drain region of low concentration. The second conductivity type semiconductor region may typically be a $P^-$ base region. The first conductivity type first region, the first conductivity type second region, and the connection region may typically be an $N^+$ source region. The $N^+$ source region is formed in a cross-sectional shape having the deep first and second regions and the connection region shallower than those. Therefore, the cross-sectional shape of the $P^-$ base region becomes an upward protruded shape at just beneath the connection portion, and a sectional area is increased by the protruded shape; and accordingly, resistance is reduced and voltage drop is suppressed.

The deep first and second regions and the connection region shallower than those are formed in the same process;

and accordingly, voltage drop across the base region can be suppressed without increasing production processes.

BRIEF DESCRIPTION OF THE DRAWINGS

The above and other objects, advantages and features of the present invention will become apparent from the following description of certain embodiments taken in conjunction with the accompanying drawings, in which:

FIGS. 1A and 1B are partial views each showing a known semiconductor device, FIG. 1A is its perspective view, and FIG. 1B is its plan view;

FIG. 2A is its perspective view, and FIG. 2B is its plan view;

FIG. 3A is its cross-sectional view taken along the line I-I shown in FIG. 2B, and FIG. 3B is its cross-sectional view taken along the line II-II shown in FIG. 2B;

FIG. 4A is its cross-sectional view taken along the line I-I shown in FIG. 2B, and FIG. 4B is its cross-sectional view taken along the line II-II shown in FIG. 2B;

FIG. 5A is its cross-sectional view taken along the line I-I shown in FIG. 2B, and FIG. 5B is its cross-sectional view taken along the line II-II shown in FIG. 2B;

FIG. 6A is its cross-sectional view taken along the line I-I shown in FIG. 2B, and FIG. 6B is its cross-sectional view taken along the line II-II shown in FIG. 2B;

FIG. 7A is its cross-sectional view taken along the line I-I shown in FIG. 2B, and FIG. 7B is its cross-sectional view taken along the line II-II shown in FIG. 2B;

FIG. 8A is its cross-sectional view taken along the line I-I shown in FIG. 2B, and FIG. 8B is its cross-sectional view taken along the line II-II shown in FIG. 2B;

FIGS. 9A and 9B are partial plan views each showing a photo mask used in the production process of the semiconductor device, FIG. 9A is a photo mask for forming a source region, and FIG. 9B is a photo mask for forming a P$^+$ base region;

FIGS. 11A and 11B are partial plan views each showing the operation of the semiconductor device, FIG. 11A is its cross-sectional view taken along the line III-III shown in FIG. 10, and FIG. 11B is its cross-sectional view taken along the line IV-IV shown in FIG. 10;

FIGS. 12A and 12B are partial plan views each showing the operation of the semiconductor device, FIG. 12A is its cross-sectional view taken along the line III-III shown in FIG. 10, and FIG. 12B is its cross-sectional view taken along the line IV-IV shown in FIG. 10;

FIG. 13A is its perspective view, and FIG. 13B is its plan view;

FIG. 14A is its cross-sectional view taken along the line V-V shown in FIG. 13B, and FIG. 14B is its cross-sectional view taken along the line VI-VI shown in FIG. 13B; FIG. 15A is a photo mask for forming a source region, and FIG. 15B is a photo mask for forming a P$^+$ base region and a P$^+$ embedded region.

DETAILED DESCRIPTION

Figure 2B:
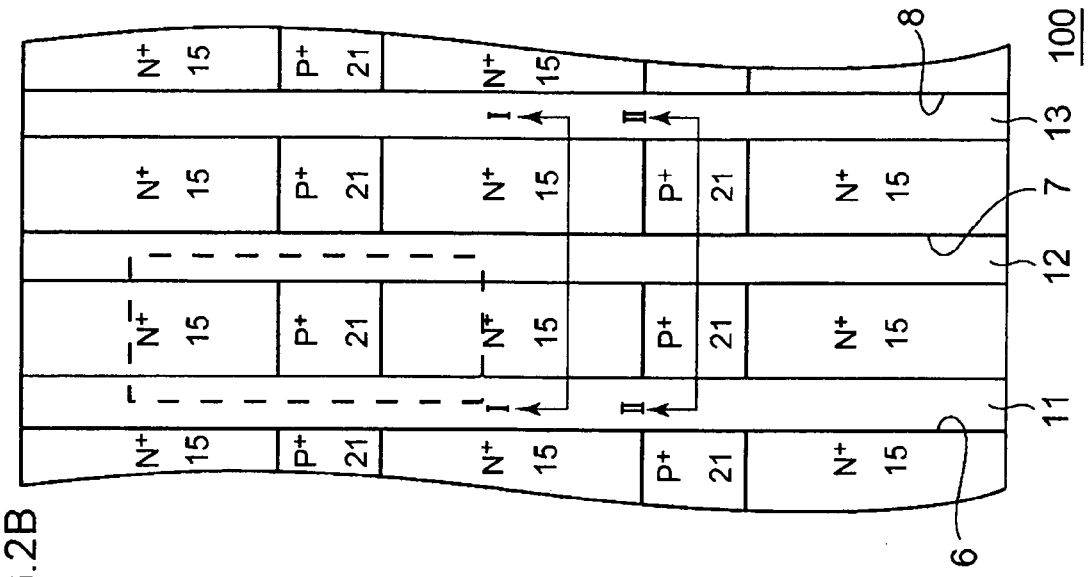
FIGS. 2A and 2B are partial views each showing a semiconductor device of a first embodiment according to the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Hereinafter, an embodiment of a method of manufacturing a semiconductor device according to the present invention will be described with reference to drawings. In addition, the same reference numerals are given to those identical to constituent elements in the description of the drawings and their detail description will not be repeated.

FIRST EMBODIMENT

Figure 2A:
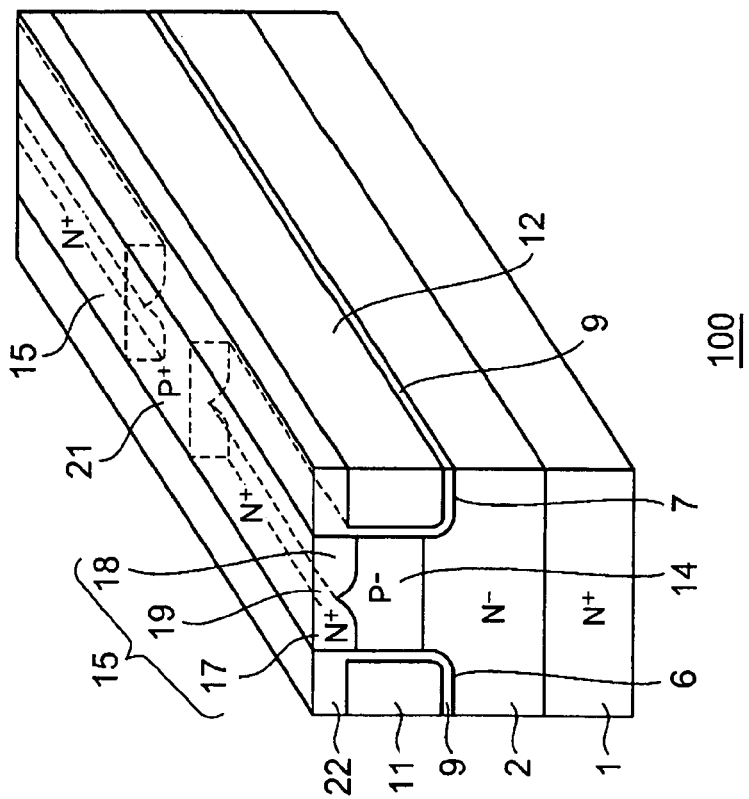

FIG. 2A is a partial perspective view showing a semiconductor device 100 of the first embodiment according to the present invention.

An N$^-$ type epitaxial layer serving as an N$^-$ drift region 2 (semiconductor base) is formed on an N$^+$ semiconductor substrate 1. The N$^+$ semiconductor substrate 1 is electrically connected to a drain electrode (not shown in the drawing) for external connection. The drain electrode may typically be formed to be in contact with the N$^+$ semiconductor substrate 1. Alternatively, the drain electrode may be formed at the opposite side of the N$^+$ semiconductor substrate 1 and may be connected with the N$^+$ semiconductor substrate 1 through a contact formed in the layers formed on the N$^+$ semiconductor substrate 1.

A first trench region 6 and a second trench region 7 arranged in elongated stripe shapes are formed in parallel with each other and extending along a first direction; and in each of them, a first trench gate electrode 11 and a second trench gate electrode 12 are formed via a gate insulating film 9.

An interlayer insulating film 22 is formed on the first and the second trench gate electrodes 11 and 12. The interlayer insulating film 22 is also formed in the first and the second trench regions 6 and 7.

The first and the second trench regions 6 and 7 may be separately formed from each other or, typically, the first and the second trench regions 6 and 7 may be continuously formed by being connected at a region not shown in the drawing. The first and the second trench gate electrodes 11 and 12 are connected with each other inside or outside the first and the second trench regions 6 and 7; and consequently, one trench gate electrode is formed and electrically connected to a gate electrode (not shown in the drawing) for external connection.

A P$^-$ base region 14 (base region) is formed between the first and the second trench regions 6 and 7 so as to be adjoined to the first and the second trench regions 6 and 7.

An N$^+$ source region 15 is formed on the P$^-$ base region 14 and between the first and the second trench regions 6 and 7 so as to be adjoined thereto. Furthermore, a P+ base region 21 (high concentration base region) is also formed on the P− base region 14 and between the first and the second trench regions 6 and 7 so as to be adjoined thereto. The N+ source region 15 and the P+ base region 21 are arranged so as to be alternately adjoined in a longitudinal direction (the first direction) of the elongated stripe. The N+ source region 15 and the P+ base region 21 are electrically connected to a source electrode (not shown in the drawing) for external connection.

A channel region is formed in the vicinity of the first and the second trench regions 6 and 7 in the P− base region 14 just beneath the N+ source region 15. With the above structure, the semiconductor device 100 functions as a vertical type MOSFET. The P+ base region 21 functions as an electrode for fixing a potential of the P− base region 14 to a potential of the source of the vertical type MOSFET.

Further, a P-N junction between the P− base region 14 and the N− drift region 2 is formed just beneath the P+ base region 21. This P-N junction functions as a diode connected in parallel between the source and the drain of the vertical type MOSFET. The source of the vertical type MOSFET and an anode of the diode are short-circuited by the source electrode. The N− drift region 2 and the N+ semiconductor substrate 1 become the drain of the vertical type MOSFET and a cathode of the diode. These operations will be described later.

The N+ source region 15 includes a first region 17 which is adjacent to the first trench region 6; a second region 18 which is adjacent to the second trench region 7; and a connection region 19 which connects the first region 17 and the second region 18. The connection region 19 is formed shallower than the first region 17 and the second region 18. The channel region of the vertical type MOSFET is formed in the P− base region 14 which is adjacent to the first and the second trench regions 6 and 7, that is, formed just beneath the first and the second regions 17 and 18. A region in the P− base region 14 just beneath the connection region 19 hardly contributes as the channel region of the vertical type MOSFET. A cross-sectional shape of the connection region 19 is formed so as to be gradually shallow from the first region 17 toward a central portion, to be the shallowest at the central portion, and to be gradually deep from the central portion toward the second region 18. Therefore, the cross-sectional shape of the P− base region 14 just beneath the connection region 19 is a shape which protrudes upward as compared with portions just beneath the first and the second regions 17 and 18 and has a pointed shape like a pointed cap. The sectional area of the P− base region 14 is increased by the protruded shape; and consequently, resistance in this portion becomes small and voltage drop is suppressed.

FIG. 2B is a partial plan view showing the semiconductor device 100. The portion surrounded by the dotted line corresponds to the portion shown in FIG. 2A.

The first trench region 6, the second trench region 7, and a third trench region 8 are arranged in parallel; and the first trench gate electrode 11, the second trench gate electrode 12, and a third trench gate electrode 13 are respectively formed therein. A plurality of the N+ source regions 15 and a plurality of the P+ base regions 21 are alternately arranged in a longitudinal direction of elongated stripes. When seen in a direction perpendicular to the longitudinal direction, there are formed columns in which a plurality of the N+ source regions 15, and the first, the second, and the third trench gate electrodes 11, 12, and 13 are alternately arranged; and columns in which a plurality of the P+ base regions 21, and the first, the second, and the third trench gate electrodes 11, 12, and 13 are alternately arranged. Its layout is such that these columns are alternately arranged in the longitudinal direction.

Next, a method of manufacturing the semiconductor device 100 will be described with reference to FIG. 3A to FIG. 8B. Each of FIGS. 3A, 4A, 5A, 6A, 7A and 8A is a cross-sectional view taken along the line I-I shown in FIG. 2B, and each of FIGS. 3B, 4B, 5B, 6B, 7B and 8B is a cross-sectional view taken along the line II-II shown in FIG. 2B.

Figure 3A:
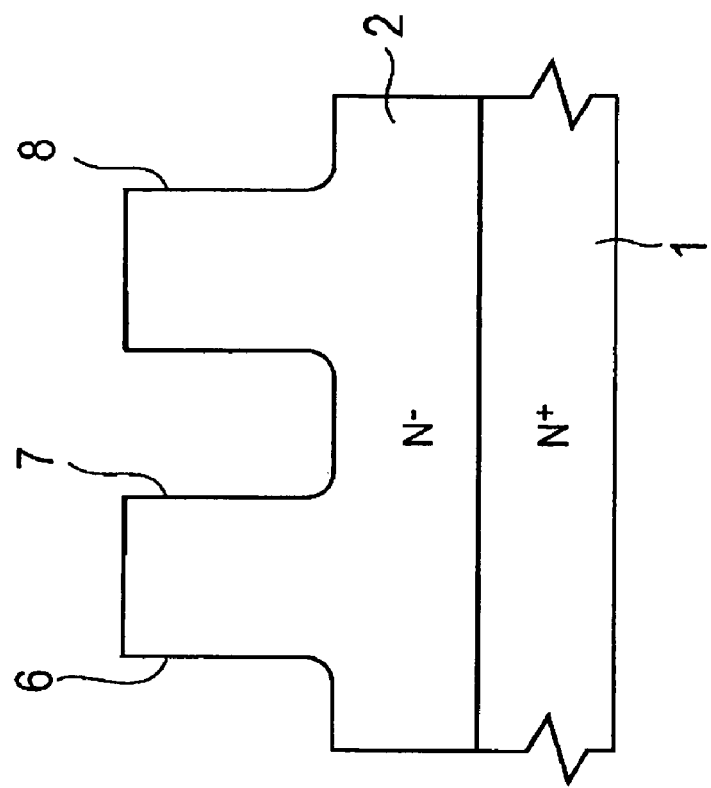
FIGS. 3A and 3B are partial cross-sectional views each showing a production process of the semiconductor device.
Figure 3B:
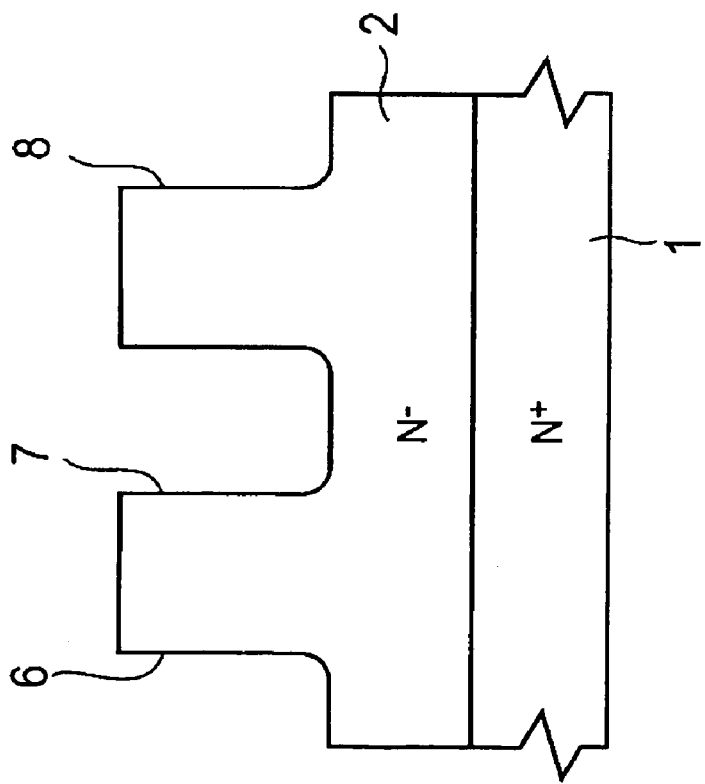

First, an N− type epitaxial layer serving as the N− drift region 2 is formed on an N+ semiconductor substrate 1. Then, the first, second, and third trench regions 6, 7, and 8 are formed in the N− drift region 2 by using a photo mask not shown in the drawing (FIGS. 3A and 3B).

Figure 4A:
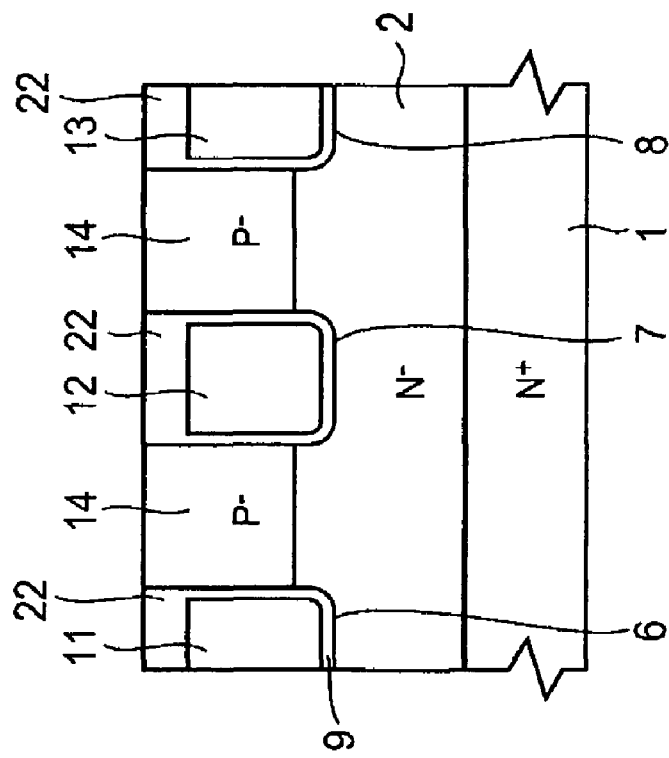
FIGS. 4A and 4B are partial cross-sectional views each showing a production process of the semiconductor device.
Figure 4B:
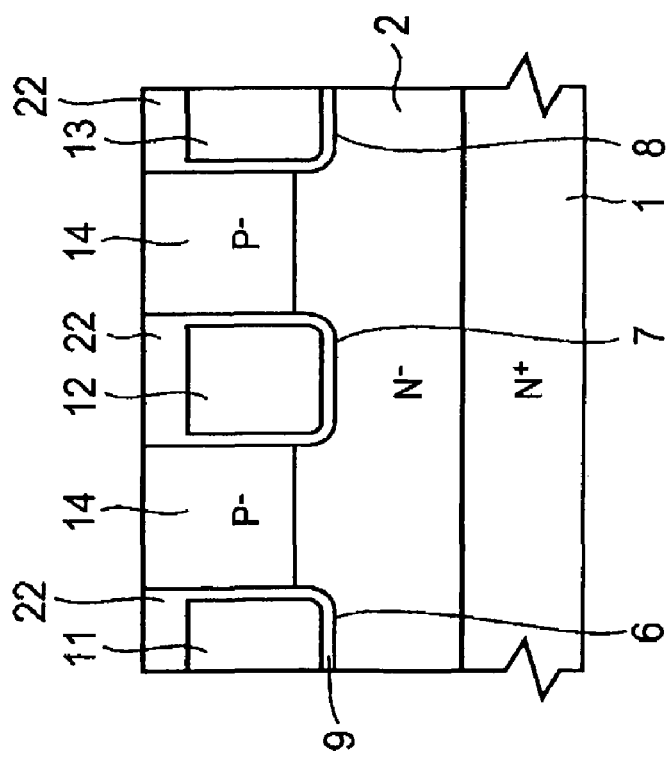

Next, a gate insulating film and a polysilicon film are formed, in this order, on the whole surface of the N− drift region 2 including the inside of the first, second, and third trench regions 6, 7, and 8. The polysilicon film formed outside the first, the second, and the third trench regions 6, 7, and 8 is etch-backed to form the first, second, and third trench gate electrodes 11, 12, and 13 inside the first, second, and third trench regions 6, 7, and 8, respectively. Next, an insulating film such as a silicon dioxide film is formed and is etch-backed to form the interlayer insulating film 22 in the first, second, and third trench regions 6, 7, and 8 so as to cover the upper portions of the first, second, and third trench gate electrodes 11, 12, and 13, respectively. Next, a P type impurity, for example, a boron of about $1 \times 10^{13}$ cm$^{-2}$ is ion-implanted and pushed-in by performing heat treatment for about 60 minute at 1000 degree centigrade to form the P− base region 14 (FIGS. 4A and 4B).

Figure 5A:
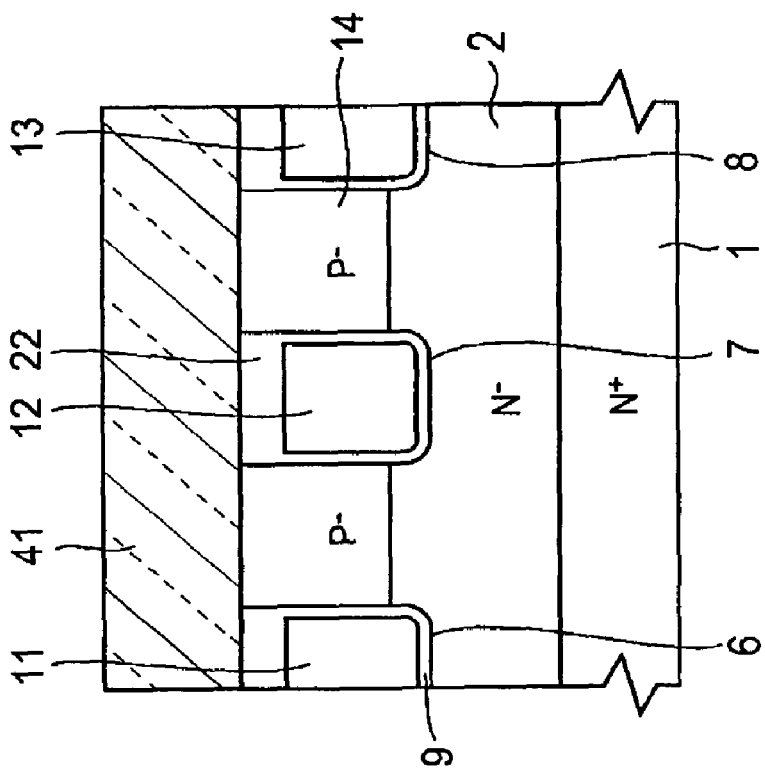
FIGS. 5A and 5B are partial cross-sectional views each showing a production process of the semiconductor device.
Figure 5B:
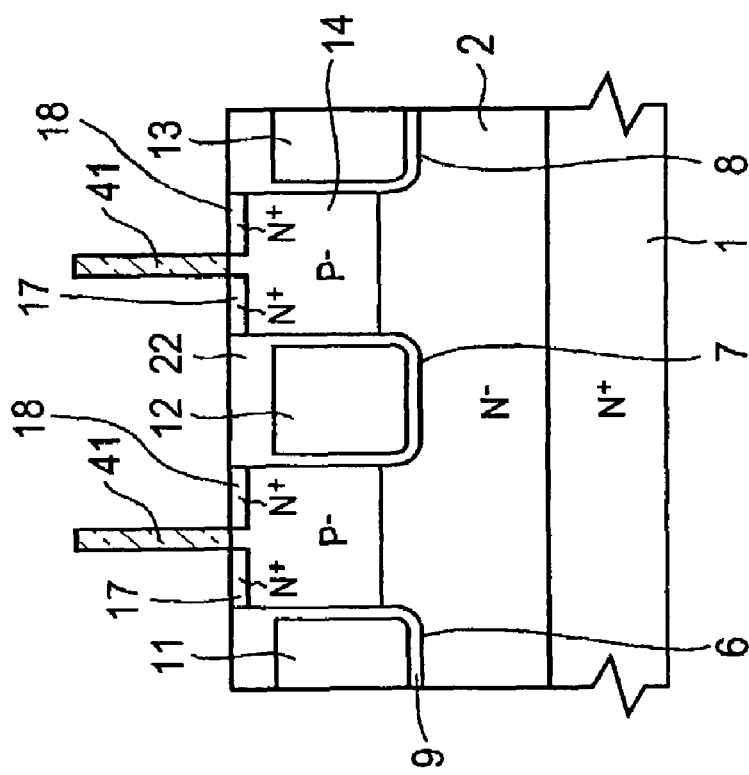

Next, a photo mask for forming a source region 41 is formed on the P− base region 14. Then, an N type impurity, for example, an arsenic of about $1 \times 10^{16}$ cm$^{-2}$ is ion-implanted at an accelerating voltage of 70 keV (FIGS. 5A and 5B). As shown in FIG. 5B, a region where the P+ base region 21 is to be formed is covered with the photo mask 41 so that the N type impurity is not ion-implanted. The photo mask 41 having a small width is formed at a region where the N+ source region 15 is to be formed so as to cover a region where a connection region 19 is to be formed.

A partial plan view of the photo mask 41 is shown in FIG. 9A. In FIG. 9A, a portion marked with oblique line patterns is a portion where photoresist is remained, and a blank portion (not marked with oblique line patterns) is a portion where the photoresist is not formed. In order to explain a positional relation, the first, second, and third trench regions 6, 7, and 8 are shown in dotted lines, though such trench regions are not actually existed. At the time when the N type impurity is ion-implanted, the first and second regions 17 and 18 are separated with each other. After that, the photo mask 41 is removed.

As to be described later, heat treatment for impurity activation is performed after P type impurity ion implantation for forming the P+ base region 21 is performed. The present embodiment shows an example in which the P type impurity ion implantation is performed after the N type impurity ion implantation for forming the N+ source region 15; however, such ion implantation order may be reversed. By heat treatment to be described later, the N type impurity is diffused outwardly; the first and second regions 17 and 18 are expanded outward and connected to form the shallow connection region 19.

The diffusion length of the ion-implanted impurities is controllable by accelerating voltage, the amount of dope, heat treatment temperature and/or heat treatment period.

When the diffusion length of arsenic after the heat treatment in a depth direction is "1", the diffusion length in a lateral direction becomes about "0.8". For example, in the case where arsenic spreads 0.5 μm in the depth direction, arsenic spreads about 0.4 μm in the lateral direction. Further, for example, in the case where arsenic spreads 0.3 μm in the depth direction, arsenic spreads about 0.24 μm in the lateral direction.

A width "$d_1$" of the photo mask 41 shown in FIG. 9A can be determined in consideration of the diffusion length of the first and second regions 17 and 18 in the lateral direction after heat treatment. For example, in the case where the first and second regions 17 and 18 expand in the depth direction by 0.3 μm, it means that each of the first and second regions 17 and 18 expands 0.24 μm in the lateral direction after heat treatment. Thus, the maximum limit width to form the connection region 19 between the first and second regions 17 and 18 becomes 0.48. In such the case, the width "$d_1$" of the photo mask 41 is set to be smaller than 0.48 μm that is the maximum limit width. The width "$d_1$" of the photo mask 41 may be set such that the width "$d_1$" becomes equal to or less than about 90% of the maximum limit width in order to surely form the connection region 19. On the other hand, if the width "$d_1$" of the photo mask 41 is too small, the depth of the connection region 19 becomes nearly equal to the first and the second regions 17 and 18. Therefore, the width "$d_1$" of the photo mask 41 may be set such that the width "$d_1$" becomes equal to or more than about 10% of the maximum limit width.

Figure 6B:
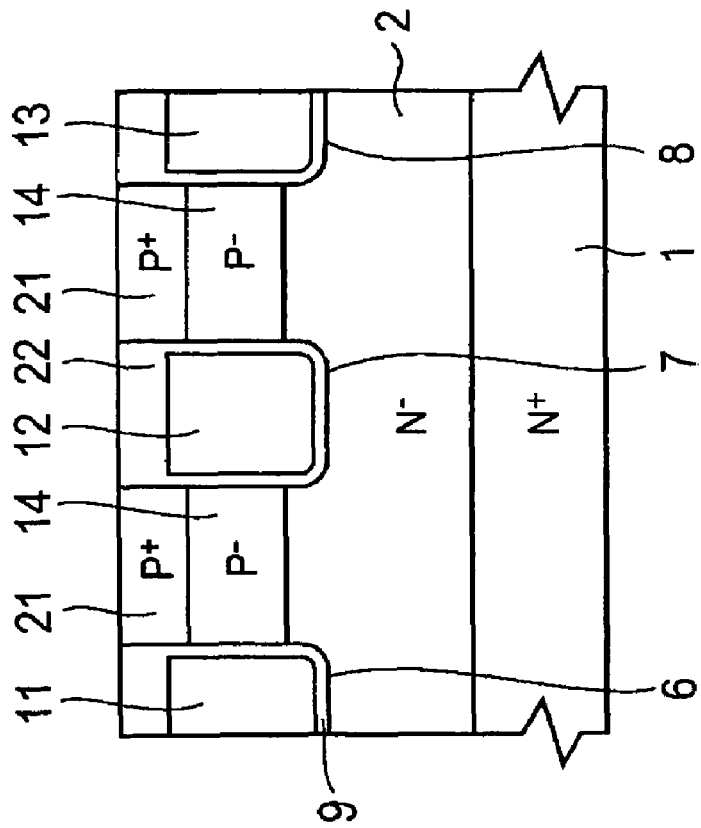
FIGS. 6A and 6B are partial cross-sectional views each showing a production process of the semiconductor device.
Figure 6A:
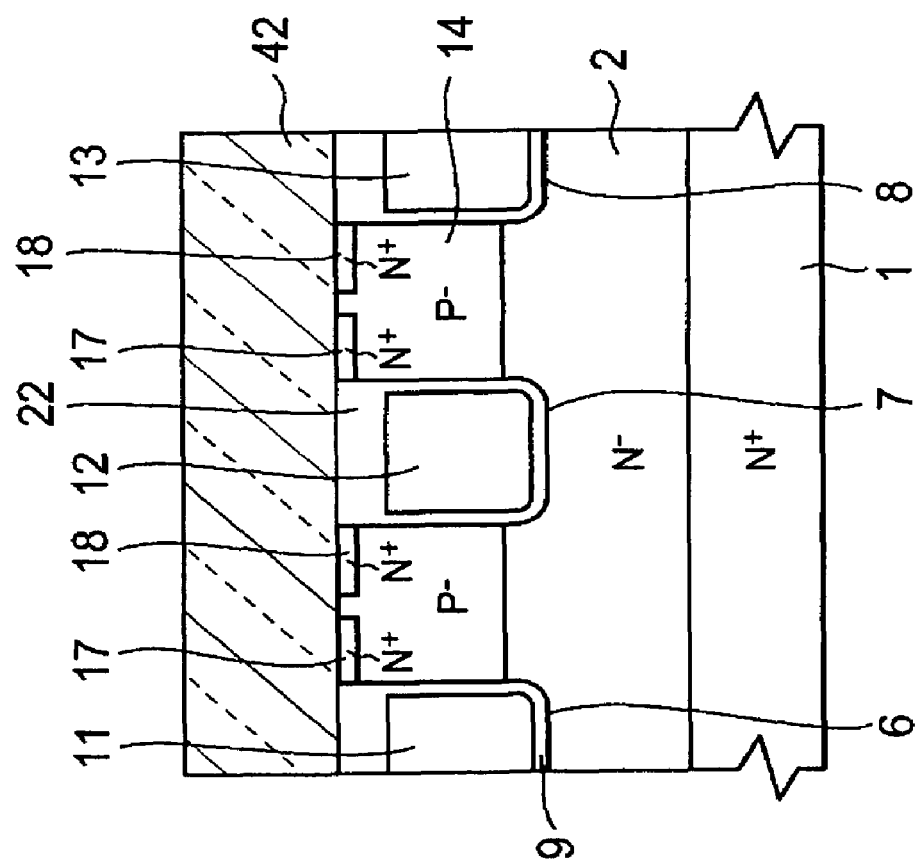

Next, a photo mask 42 for forming the P+ base region 21 is formed; and the P type impurity, for example, a boron of about 5×1015 cm$^{-2}$ is ion-implanted at an accelerating voltage of 30 keV (FIGS. 6A and 6B). A partial plan view of the photo mask 42 is shown in FIG. 9B. In FIG. 9B, a portion marked with oblique line patterns is a portion where photoresist is remained, and a blank portion (not marked with oblique line patterns) is a portion where the photoresist is not formed. In order to explain a positional relation, the first, second, and third trench regions 6, 7, and 8 are shown in dotted lines, though such trench regions are not actually existed. After that, the photo mask 42 is removed.

Next, an insulating film (not shown in the drawing) capable of reflowing, such as boron-doped phospho silicate glass (BPSG), is formed entirely. Although a surface of the interlayer insulating film 22 is evenly depicted in FIGS. 4A and 4B, actually, as overetching is performed so that the interlayer insulating film 22 is not remained on a surface of the P− base region 14, a concave is formed at the upper surface of the interlayer insulating film 22. By forming the insulating film capable of reflowing such as BPSG, planarizing the surface by reflowing, and then etch-backing, the upper surface of the interlayer insulating film 22 becomes more even.

Figure 7A:
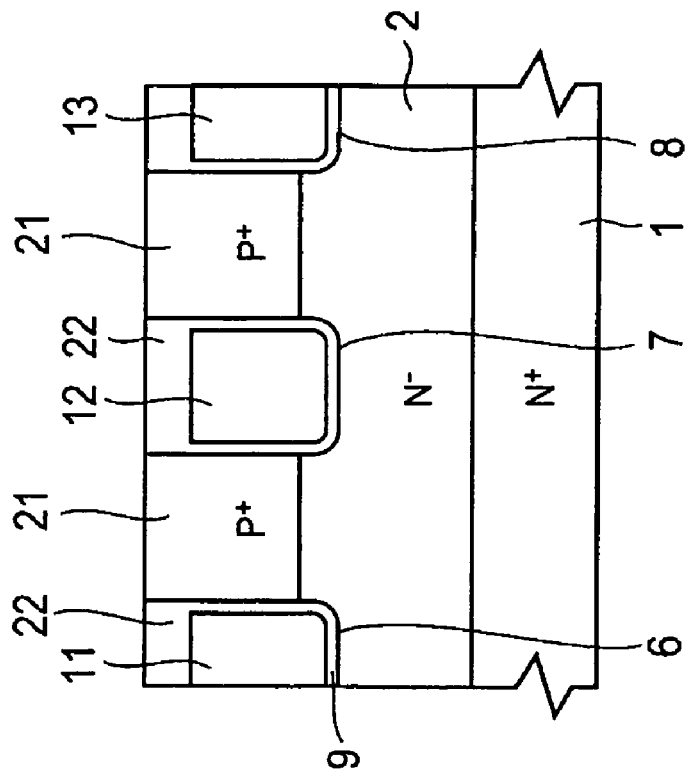
FIGS. 7A and 7B are partial cross-sectional views each showing a production process of the semiconductor device.
Figure 7B:
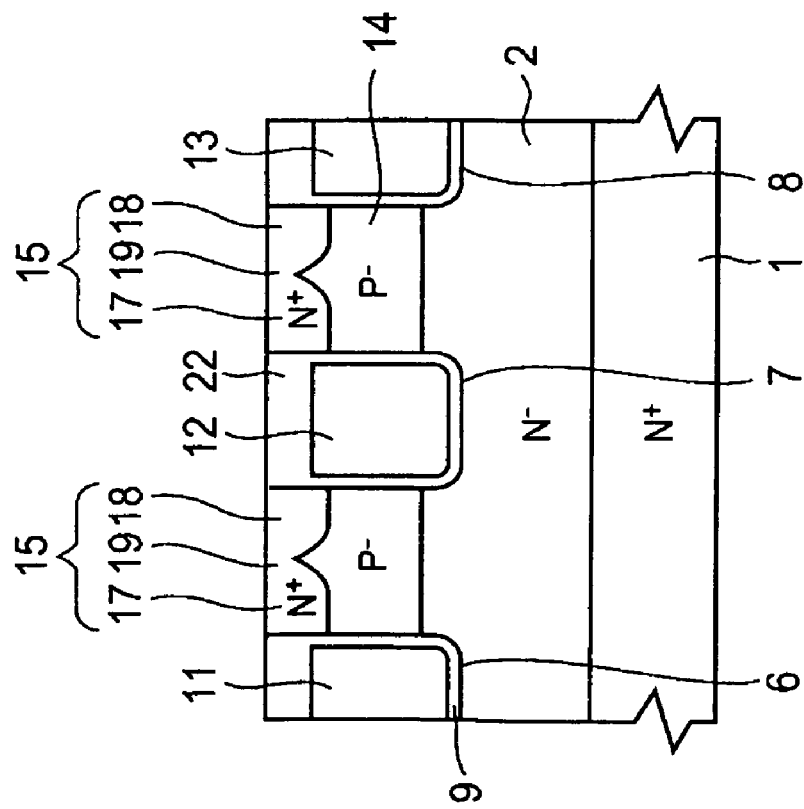

In this embodiment, reflow of BPSG and activation of impurities are performed at the same time. The heat treatment is performed, for example, for about 30 min at 1000 degree centigrade in nitrogen atmosphere. By this heat treatment, as shown in FIG. 7A, in the N+ source region 15, the doped N type impurity in the first and second regions 17 and 18 is diffused outwardly in the depth direction and in the lateral direction to form the first and second regions 17 and 18 having a first depth and the connection region 19 having a second depth shallower than the first depth. At the same time, as shown in FIG. 7B, also in the P+ base region 21, the doped P type impurity is diffused outwardly in the depth direction. As the diffusion length of boron is larger than that of arsenic, the P+ base region 21 reaches the N− drift region 2 after the heat treatment. Then, the BPSG is etch-backed to expose the N+ source region 15 and the P+ base region 21 (FIGS. 7A and 7B).

Next, a barrier metal 23 such as titanium/titanium nitride is formed on the N+ source region 15, the P+ base region 21, and the interlayer insulating film 22. Then, a source electrode 25 formed of a metal such as aluminum or copper is formed on the barrier metal 23.

Figure 8A:
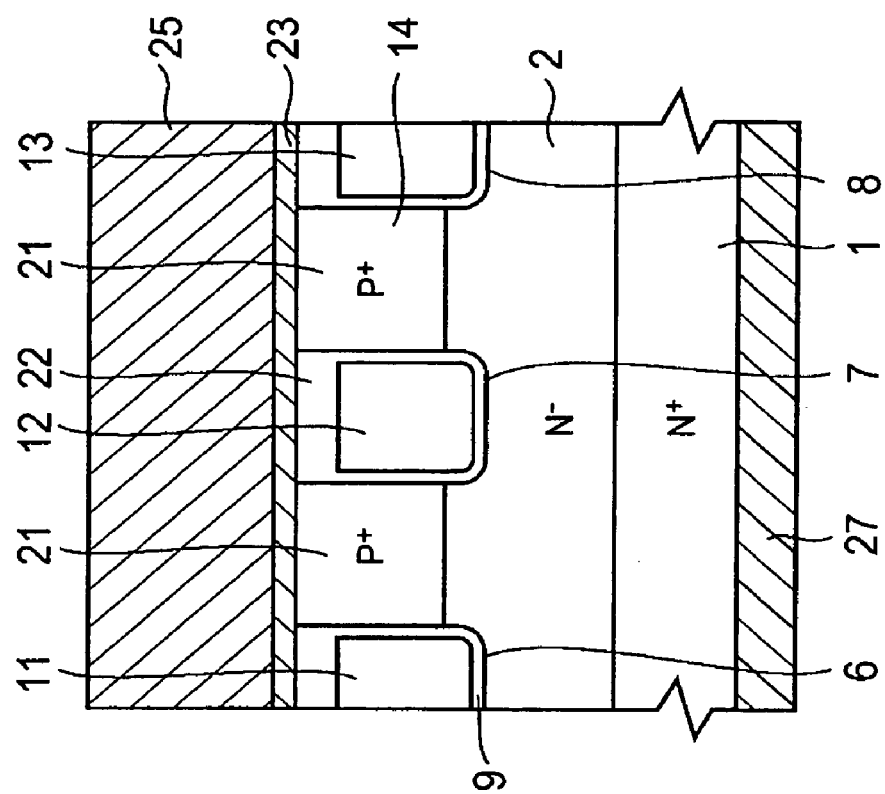
FIGS. 8A and 8B are partial cross-sectional views each showing a production process of the semiconductor device.
Figure 8B:
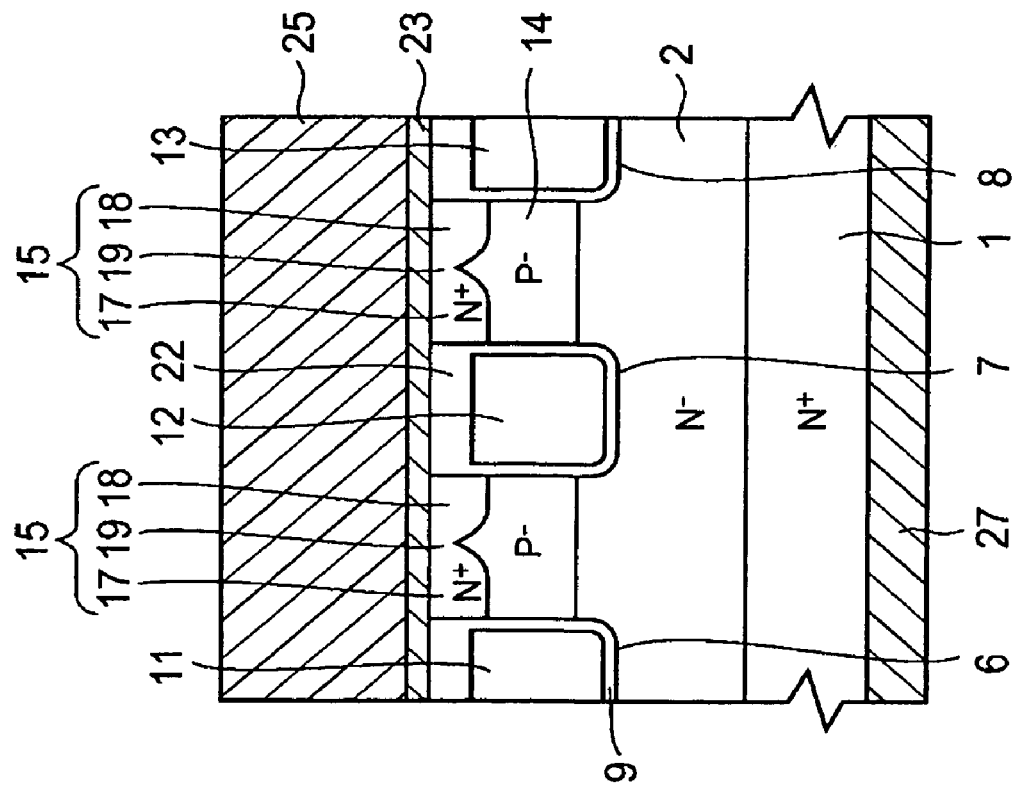

In the case where the drain electrode is formed on the backside of the N+ semiconductor substrate 1, the backside of the N+ semiconductor substrate 1 is polished and thinned as needed. Then, a drain electrode 27 formed of a metal such as titanium, nickel and silver or a metal such as titanium, nickel and gold is formed at the backside of the N+ semiconductor substrate 1 (FIGS. 8A and 8B). With the above methods, the semiconductor device 100 can be formed.

Figure 10:
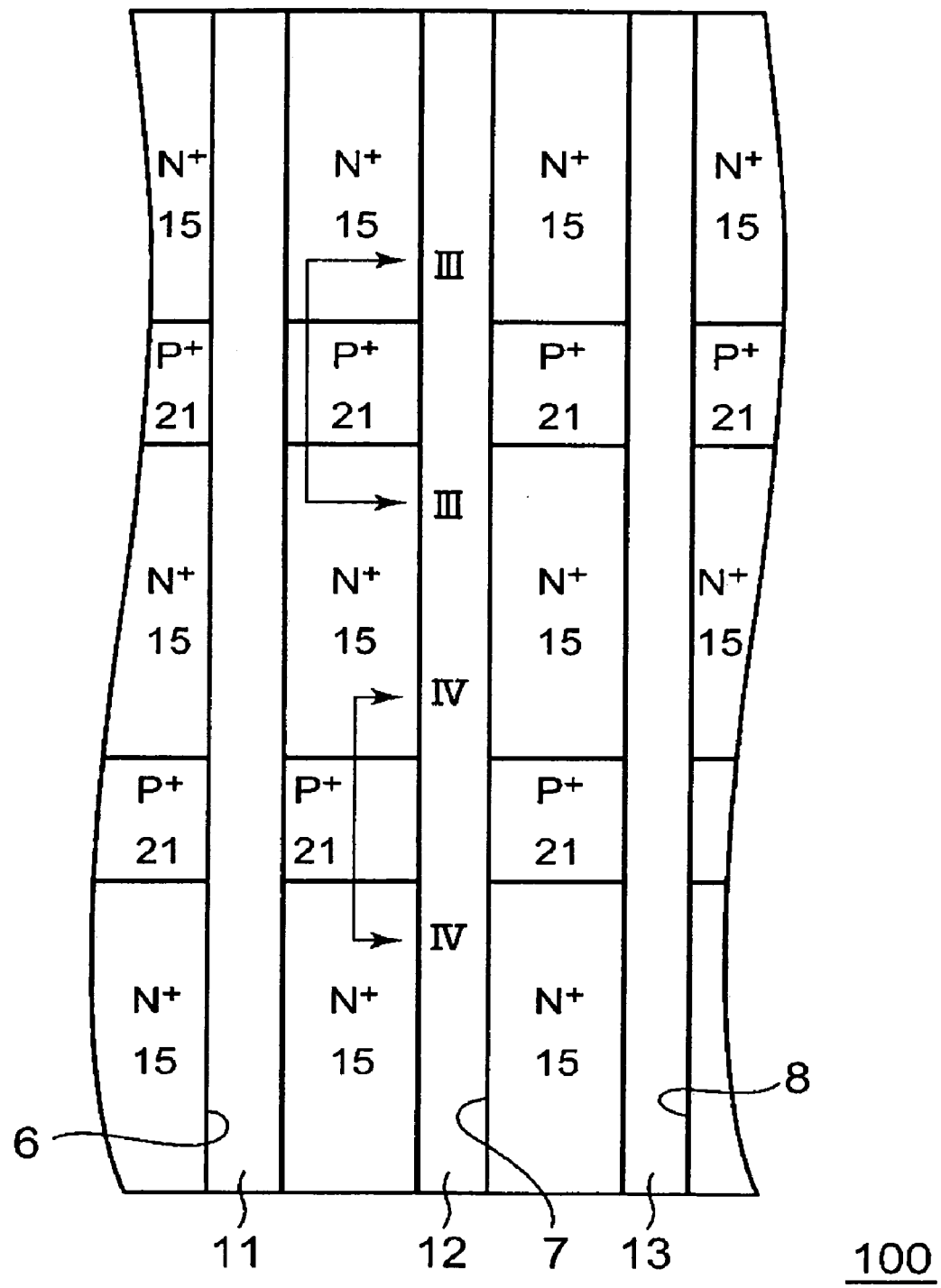
FIG. 10 is a partial plan view showing the semiconductor device.

Next, the operation of the semiconductor device 100 will be described. FIG. 10 is a partial plan view showing the semiconductor device 100. FIGS. 11A and 12A are cross-sectional views taken along the line III-III shown in FIG. 10. FIGS. 11B and 12B are cross-sectional views taken along the line IV-IV shown in FIG. 10. A cross-section taken along the line III-III is a cross-section in which a channel region just beneath the first region 17 is cut in an elongated stripe direction; and a cross-section taken along the line IV-IV is a cross-section in which a region just beneath the connection region 19 is cut in the same direction.

A state where the vertical type MOSFET is turned ON will be described with reference to FIGS. 11A and 11B.

The channel region is formed in the P− base region 14 adjacent to the first trench region 6, and turn-ON current flows from the drain electrode (not shown in the drawing) to the source electrode (not shown in the drawing) via the N+ semiconductor substrate 1, the N− drift region 2, the P− base region 14, and the first region 17 (FIG. 11A). An arrow denotes a direction in which the turn-ON current flows.

On the other hand, the connection region 19 is away from each of the first and the second trench regions 6 and 7, and the channel region is not formed down to a region just beneath the connection region 19. Therefore, the turn-ON current flown via the N+ semiconductor substrate 1 and the N− drift region 2 does not flow into the connection region 19 and the P− base region 14 just beneath thereof but the turn-ON current flows toward the channel region formed beneath the first and second regions 17 and 18 as shown in FIG. 11B. In other words, the turn-ON current is almost uniform in current density in the N+ semiconductor substrate 1; however, the turn-ON current is concentrated toward the channel region when passing through the N− drift region 2.

A state where the vertical type MOSFET is turned OFF will be described with reference to FIGS. 12A and 12B.

When the vertical type MOSFET is turned OFF and a high surge voltage is applied to the drain electrode, avalanche break-down is caused at the P-N junction between the N− drift region 2 and the P+ base region 21, and avalanche current flows from the N+ semiconductor substrate 1 toward the P− base region 21. As shown in FIG. 12A, the P− base region 14 is narrow at just beneath the first region 17; and therefore, resistance is high and it becomes difficult to flow the avalanche current. However, as shown in FIG. 12B, a sectional area of the P− base region 14 is wide at just beneath the connection region 19; and therefore, the resistance is small and it becomes easy to flow the avalanche current.

The vertical type MOSFET has a parasitic bipolar transistor in which the N+ source region 15, the P− base region 14, and the N− drift region 2 serve as an emitter, a base, and a collector, respectively. If the resistance of the P− base region 14 is high, a potential of the P− base region 14 is easily increased when the avalanche current continues to flow and when the potential exceeds a threshold, the parasitic bipolar transistor is turned ON, and a current that is equal to or more than the avalanche current flows through the parasitic bipolar transistor; and consequently, the vertical type MOSFET is broken. However, according to the semiconductor device 100 of the present embodiment, at just beneath the connection region 19, the P⁻ base region 14 is widened to reduce the resistance; and therefore, it becomes difficult to increase the potential of the P⁻ base region 14, and it is possible to suppress that the parasitic bipolar transistor is turned ON.

According to the related art as shown in FIGS. 1A and 1B, the P⁺ region 317 is formed; and accordingly, a rise in potential of the P⁻ body region 310 is suppressed. However, additional steps of forming the P⁺ region 317 including formation of a photo mask and ion implantation of impurities are required.

On the other hand, according to the present embodiment, the first and second regions 17 and 18 and the connection region 19 shallower than the first and second regions 17 and 18 are formed by forming the photo mask 41 at the central portion between the first and second trench regions 6 and 7; ion-implanting impurities and performing heat treatment. These steps are same as forming the N⁺ source region 308 of the related art as shown in FIGS. 1A and 1B. The first and second regions 17 and 18 and the connection region 19 of the semiconductor device 100 of the present embodiment can be formed only by changing patterns of the photo mask for forming the N⁺ source region 15. With this structure, the P⁻ base region 14 is widened and the resistance can be reduced.

SECOND EMBODIMENT

Figure 13A:
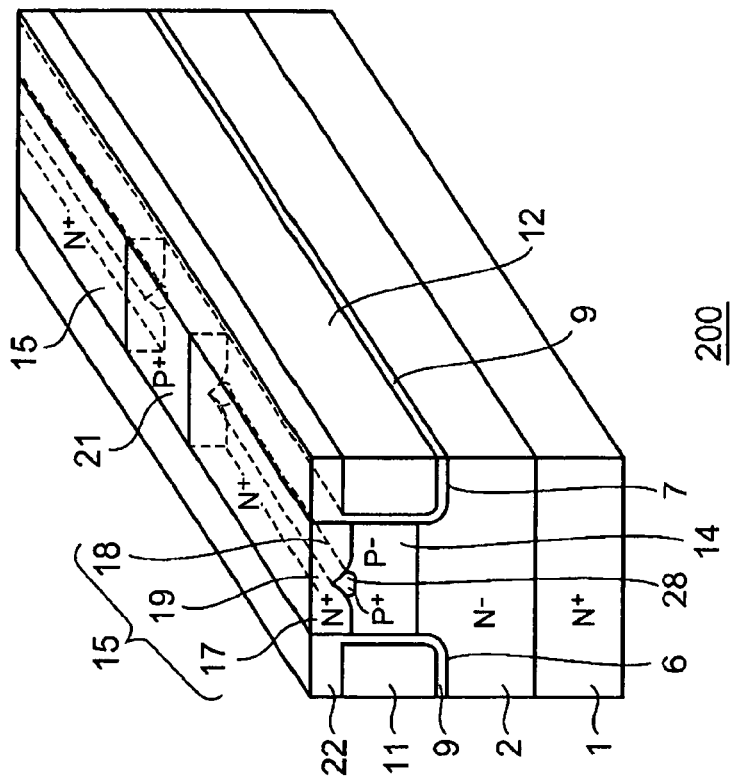
FIGS. 13A and 13B are partial views each showing a semiconductor device of a second embodiment according to the present invention.

FIG. 13A is a partial perspective view showing a semiconductor device 200 of a second embodiment according to the present invention. A main difference from the semiconductor device 100 of the first embodiment is to further form a P⁺ embedded region 28 at just beneath a connection region 19. The P⁺ embedded region 28 is formed along the connection region 19; and accordingly, a combined resistance of the P⁻ base region 14 and the P⁺ embedded region 28 becomes smaller than the resistance of the P⁻ base region 14 of the semiconductor device 100. Therefore, a parasitic bipolar transistor becomes more difficult to turn ON.

Figure 13B:
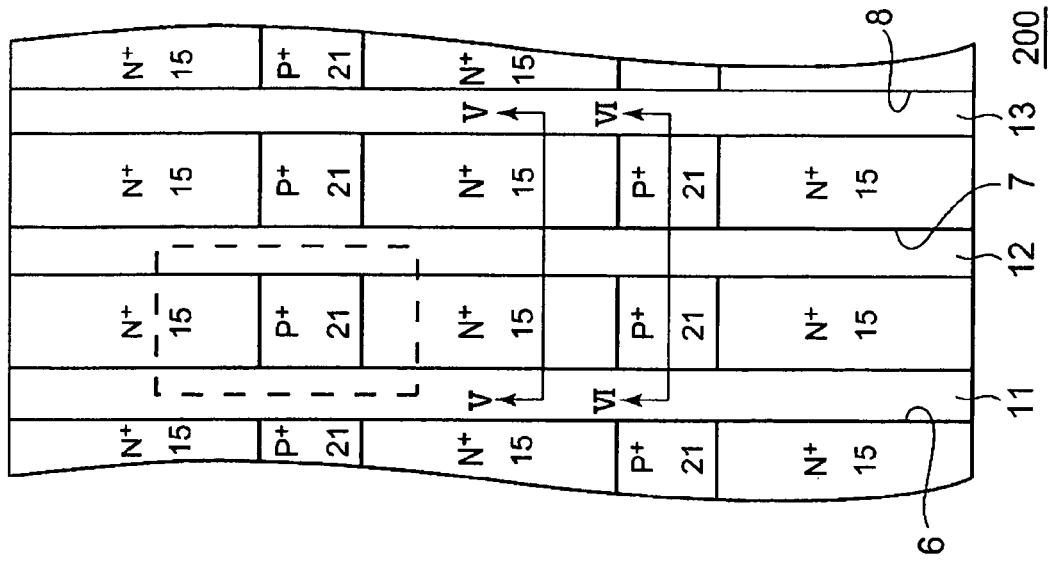
Figure 14A:
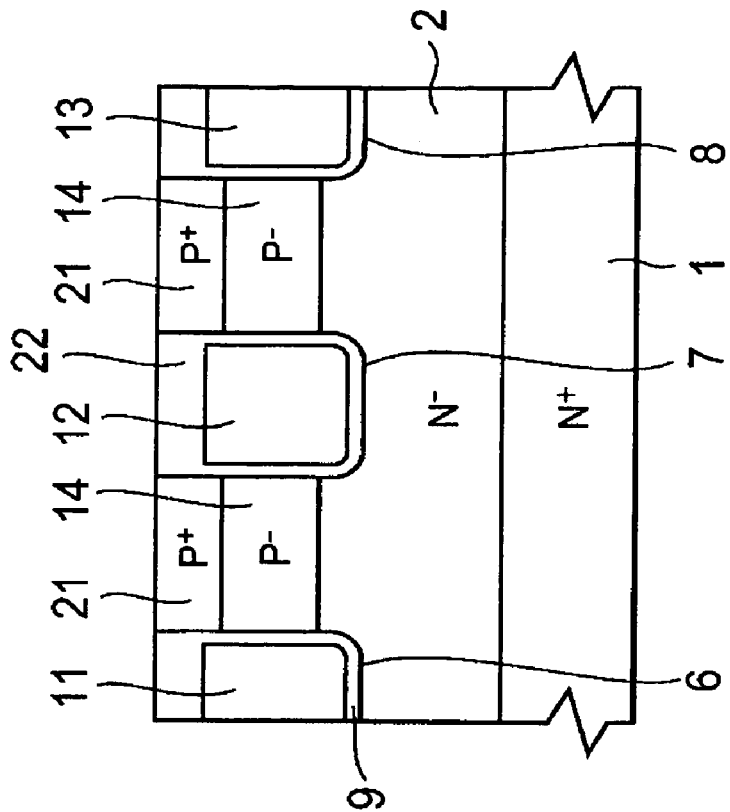
FIGS. 14A and 14B are partial cross-sectional views each showing a production process of the semiconductor device.

Next, a method of manufacturing the semiconductor device 200 will be described with reference to FIGS. 13B to 14B. FIG. 13B is a partial plan view showing the semiconductor device 200. The portion surrounded by the dotted line corresponds to the portion shown in FIG. 13A. FIG. 14A is a cross-sectional view taken along the line V-V shown in FIG. 13B, and FIG. 14B is a cross-sectional view taken along the line VI-VI shown in FIG. 13B.

By performing the same processes as the method of manufacturing the semiconductor device 100, as shown in FIGS. 5A and 5B, the photo mask 41 (see FIG. 15A) for forming the source region is formed and then the N type impurity is ion-implanted to form the first and second regions 17 and 18 which are separated with each other.

Figure 14B:
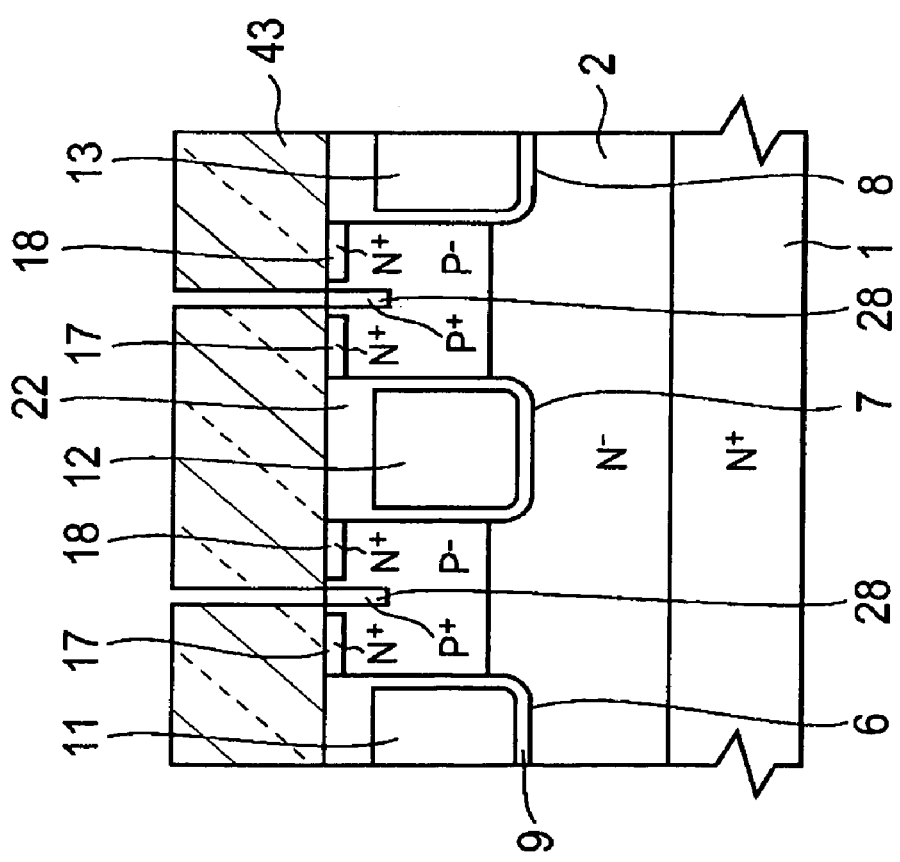

Next, a photo mask 43 for forming the P⁺ base region 21 and the P⁺ embedded region 28 is formed, and a P type impurity, for example, a boron of about $5 \times 10^{15}$ cm⁻² is ion-implanted at an accelerating voltage 30 keV (FIGS. 14A and 14B). Concentration of the N type impurity implanted in the first and second regions 17 and 18 is higher than that of the P type impurity; and therefore, the connection region 19 is formed by the subsequent heat treatment.

Figure 15B:
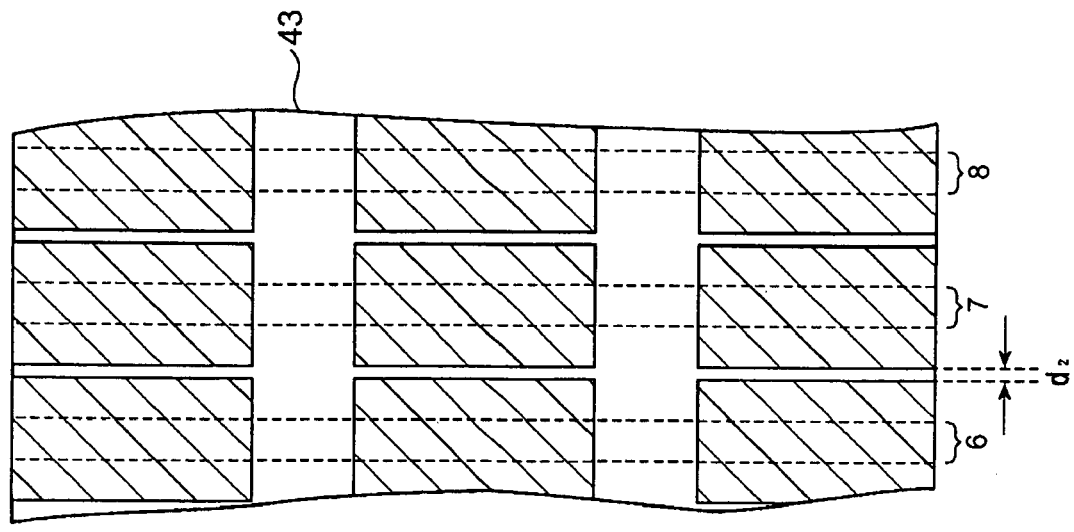
FIGS. 15A and 15B are partial plan views each showing a photo mask used in the production process of the semiconductor device.

A partial plan view of the photo mask 43 is shown in FIG. 15B. In FIG. 15B, a portion marked with oblique line patterns is a portion where photoresist is remained, and a blank portion (not marked with oblique line patterns) is a portion where the photoresist is not formed. In order to explain a positional relation, the first, second, and third trench regions 6, 7, and 8 are shown in dotted lines, though such trench regions are not actually existed. In a region where the P⁺ embedded region 28 is to be formed, elongated slits are formed in the photo mask 43. A width of the slit is designed so that a width of the P⁺ embedded region 28 after being heat-treated is equal to or less than a width of the connection region 19. For example, a width of the photo mask 43 is designed so that the width of the P⁺ embedded region 28 after being heat-treated becomes same as a designed width (shown as "$d_1$" in FIG. 15A) between the first and second regions 17 and 18 of the photo mask 41 for forming the source region.

After removing the photo mask 43, same as in the semiconductor device 100, BPSG or the like is formed and reflow of the BPSG and activation of impurities are performed at the same time. For example, the heat treatment is performed for about 30 min at 1000 degree centigrade in nitrogen atmosphere. By this heat treatment, in the N⁺ source region 15, the doped N type impurity is diffused outwardly, and the first and second regions 17 and 18 having a first depth and the connection region 19 having a second depth shallower than the first depth are formed. At the same time, also in the P⁺ base region 21 and the P⁺ embedded region 28, the doped P type impurity is diffused outwardly in the depth direction. As outward diffusion length of boron is larger than that of arsenic, the P⁺ base region 21 reaches the N⁻ drift region 2 after the heat treatment.

Figure 15A:
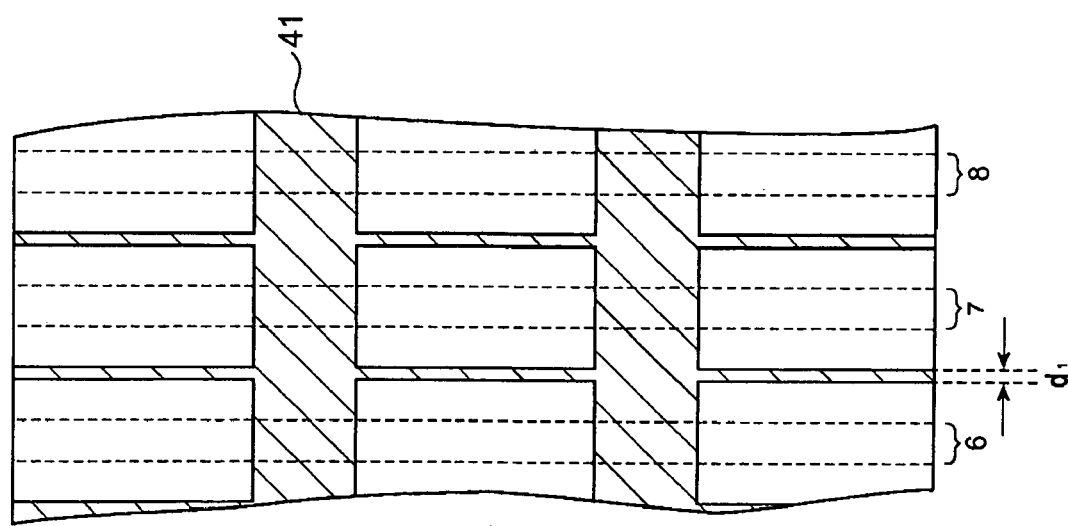

On the other hand, in the P⁺ embedded region 28, the amount of the P type impurity to be implanted is suppressed so that the P type impurity is not excessively diffused in a lateral direction. The amount of the P type impurity in the P⁺ embedded region 28 can be controlled by the width of the elongated slit to be formed in the photo mask 43. For example, as shown in FIGS. 15A and 15B, the width "$d_2$" of the slit in the photo mask 43 is formed to be narrower than the width "$d_1$" of the slit in the photo mask 41.

The outward diffusion length of the impurity also depends on the amount of impurities; and therefore, in the P⁺ embedded region 28 in which the amount of the P type impurity is small, the outward diffusion length becomes smaller than the P⁺ base region 21. Therefore, as shown in FIG. 13A, the P⁺ embedded region 28 can be formed so as not to reach the N⁻ drift region 2 even after the heat treatment.

If the width "$d_2$" of the photo mask 43 is narrow, the P⁺ embedded region 28 is formed to be shallow so as not to reach the N⁻ drift region 2 as shown in FIG. 13A. However, when a thickness of a channel region (for example, a width of the first region 17, that is, a distance between the first trench region 6 and the connection region 19) can be sufficiently secured even when the width of the P⁺ embedded region 28 in the lateral direction becomes broader to a certain extent, the width "$d_2$" of the slit of the photo mask 43 can be widened. As a result, even the P⁺ embedded region 28 reaches the N⁻ drift region 2, there is no problem in electrical characteristics. In addition, the P⁺ embedded region 28 needs to be formed at a position which is deeper than the connection region 19. Acceleration energy of the ion implantation of the P type impurity may be determined so that the peak of impurity concentration appears under the connection region 19.

Patterns of the photo mask are merely changed so as to add the elongated slit in the photo mask for forming the P⁺ base region 21; and accordingly, the P⁺ embedded region 28 can be formed in the P⁻ base region 14 without adding the independent photo mask formation process and the independent impurity ion implantation process.

After that, a source electrode, a gate electrode, and a drain electrode may be formed as in the semiconductor device 100.

The semiconductor device and the method of manufacturing the same according to the present invention are not limited to the above mentioned embodiments, but various changes and modifications can be made.

For example, in the respective embodiments, the description is made by using the power MOSFET as an example; however, an insulated gate bipolar transistor (IGBT) may be used. Furthermore, the description is made that the first conductivity type is the N type and the second conductivity type is the P type; however, it may be vice-versa. Besides, the description is made that the $P^+$ base region 21 is in contact with the $N^-$ drift region 2; however, the $P^-$ base region 14 may be remained between the $P^+$ base region 21 and the $N^-$ drift region 2. In addition, the description is made that an insulating film capable of reflowing, such as BPSG is formed, and heat treatment of reflow and impurity activation is performed at the same time; however, the formation of the BPSG or the like and the reflow are not indispensable. Further, heat treatments of the $P^+$ base region 21 and the $N^+$ source region 15 are not necessarily performed at the same time; but, the heat treatments may be separately performed.

It is apparent that the present invention is not limited to the above embodiment, and may be modified and changed without departing from the scope and spirit of the invention.

What is claimed is:

1. A method of manufacturing a semiconductor device, comprising:
   forming a first trench region and a second trench region adjacent from each other in a first conductivity type semiconductor base;
   forming a second conductivity type semiconductor region in said semiconductor base between said first trench region and said second trench region;
   forming a mask on said second conductivity type semiconductor region, said mask covering a central portion between said first trench region and said second trench region;
   performing ion implantation of a first conductivity type impurity in said second conductivity type semiconductor region with said mask to form a first conductivity type first region and a first conductivity type second region separated from said first conductivity type first region; and
   performing heat treatment to diffuse said impurity in said first conductivity type first region and said first conductivity type second region and to form a connection region between said first conductivity type first region and said first conductivity type second region, connection region being shallower than said first conductivity type first region and said first conductivity type second region after said heat treatment.

2. The method according to claim 1, further comprising:
   forming a trench gate electrode in each of said first trench region and said second trench region.

3. The method according to claim 2,
   wherein said semiconductor base serves as a drain region;
   said second conductivity type semiconductor region serves as a base region; and
   said first conductivity type first region, said first conductivity type second region, and said connection region serve as a source region.

4. The method according to claim 3, wherein said first trench region and said second trench region are formed in elongated stripe shapes extending in parallel along a first direction and in said forming a said second conductivity type semiconductor region, said semiconductor region is formed in an elongated stripe shape in said,
   said method further comprising:
   forming a second conductivity type high concentration base in said source region to separate said source region in said first direction such that said source region and said high concentration base are arranged so as to be alternately adjoined in said first direction.

5. The method according to claim 4,
   wherein said high concentration base region is formed to be adjacent to both of said first trench region and said second trench region.

6. The method according to claim 1, further comprising:
   after said performing ion implantation of said first conductivity type impurity, forming an insulating film capable of reflowing, and
   wherein in said performing heat treatment, said insulating film being reflowed at the same time.

7. The method according to claim 1, further comprising:
   forming a second conductivity type high concentration embedded region under said connection region.

8. The method according to claim 4, further comprising:
   forming a second conductivity type high concentration embedded region under said connection region, and
   wherein said high concentration embedded region is formed at the same time together with said high concentration base region in said forming a second conductivity type high concentration base.

9. A semiconductor device, comprising:
   a semiconductor body of a first conductivity type;
   a base region of a second conductivity type formed in an upper portion of said semiconductor body;
   first and second source regions of the first conductivity type formed in an upper portion of said base region, said first and second source regions being separated from each other;
   a high concentration base region of the second conductivity type formed in an upper portion of said base region, said high concentration base region being sandwiched by said first and second source regions in a plan view; and
   a first trench region and a second trench region adjacent from each other in a semiconductor region, said first and second trench regions sandwiching said base region, said first source region, said high concentration base region, and said second source region therebetween in a plan view, each of said first and second trench regions including a trench gate electrode therein,
   wherein each of said first and second source regions includes:
   a first region having a first depth and contacting with said first trench region;
   a second region having the first depth and contacting with said second trench region; and
   a connecting region formed between said first region and said second region and having a second depth shallower than the first depth.

10. The semiconductor device according to claim 9, wherein said base region has a pointed shape under said connecting portion.

11. The semiconductor device according to claim 9, wherein said high concentration base region is defined as a first high concentration base region, said semiconductor device further comprises a second high concentration base region of the second conductivity type which is formed in an upper portion of said base region and separated from said first high concentration base region, said first and second high concentration base regions sandwich said second source region therebetween in a plan view.

* * * * *